United States Patent [19]

Ogura

[11] Patent Number: 4,935,769
[45] Date of Patent: Jun. 19, 1990

[54] IMAGE FORMING APPARATUS AND METHOD
[75] Inventor: Mitsuru Ogura, Nara, Japan
[73] Assignee: Sharp Kabushiki Kaisha, Osaka, Japan
[21] Appl. No.: 217,662
[22] Filed: Jul. 12, 1988
[30] Foreign Application Priority Data
  Jul. 15, 1987 [JP] Japan ................... 62-177974
  Jul. 15, 1987 [JP] Japan ................... 62-177975
[51] Int. Cl.$^5$ .................. G03B 27/32; G03B 27/52
[52] U.S. Cl. ........................ 355/27; 355/100; 355/106; 430/138
[58] Field of Search ............... 355/27, 28, 29, 100, 355/106; 430/138

[56] References Cited
U.S. PATENT DOCUMENTS
  3,452,181  6/1969  Stryjewski .................. 355/27
  3,536,401 10/1970  Mason et al. ............... 355/73
  4,444,485  4/1984  Kogane ...................... 355/29
  4,737,822  4/1988  Taniguchi et al. ........... 355/28

Primary Examiner—Monroe H. Hayes
Attorney, Agent, or Firm—Flehr, Hohbach, Test, Albritton & Herbert

[57] ABSTRACT

An image forming apparatus has a pair of rollers normally in contact with each other. An invisible image is formed on a light-accepting sheet in the form of a roll sheet coated with microcapsules which harden when exposed to light. The image carrying sheet is kept halfway wrapped around one of these rollers and compressed between them together with an image receiving sheet such that microcapsules remaining soft are ruptured and a visible image is formed on the image receiving sheet. After each cycle of image forming processes is completed, the roll sheet is moved backward by a specified distance to reduce waste and the rollers are moved apart so that the roll sheet can correct itself if it is beginning to wrinkle or to move sideways.

6 Claims, 5 Drawing Sheets

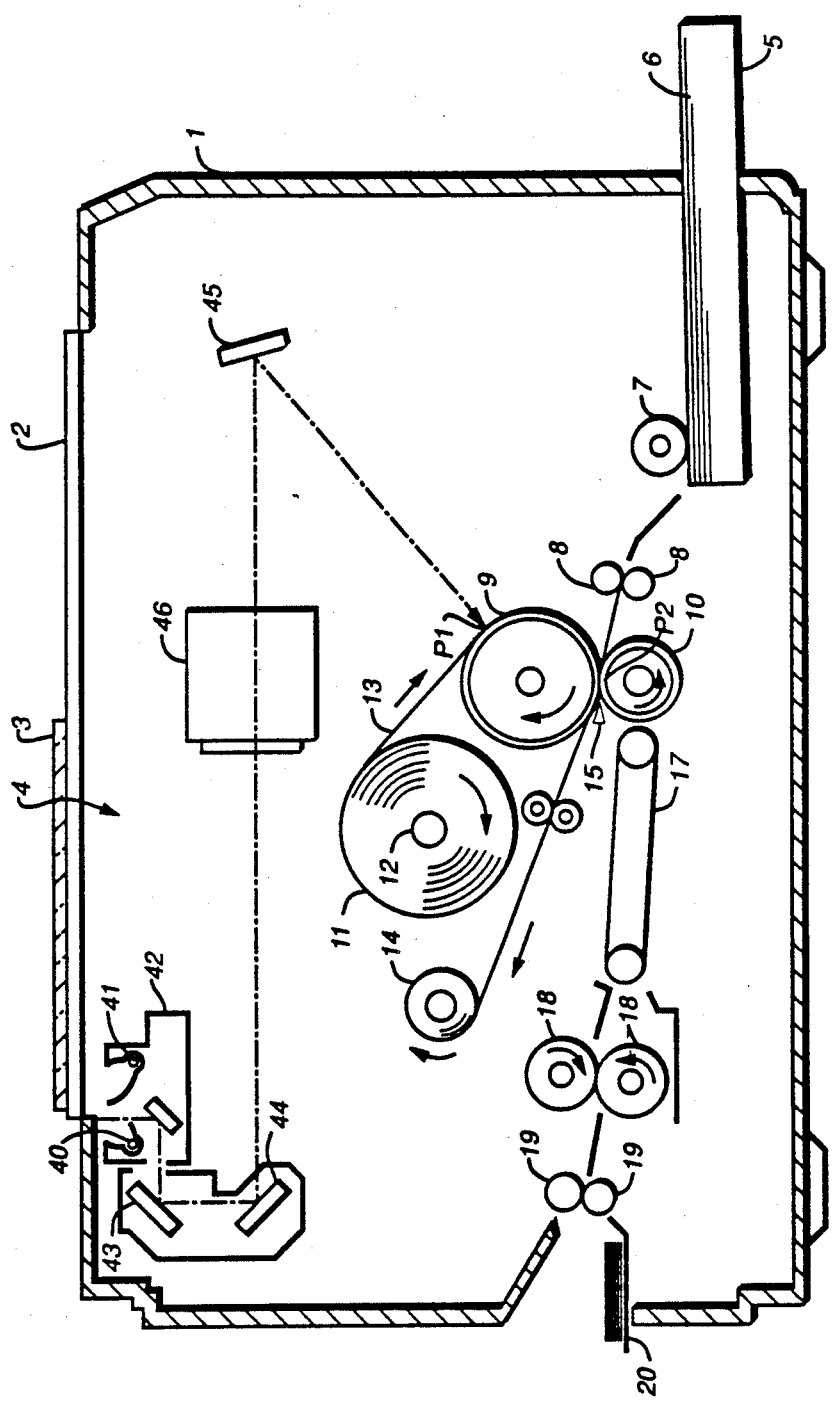
FIG._1

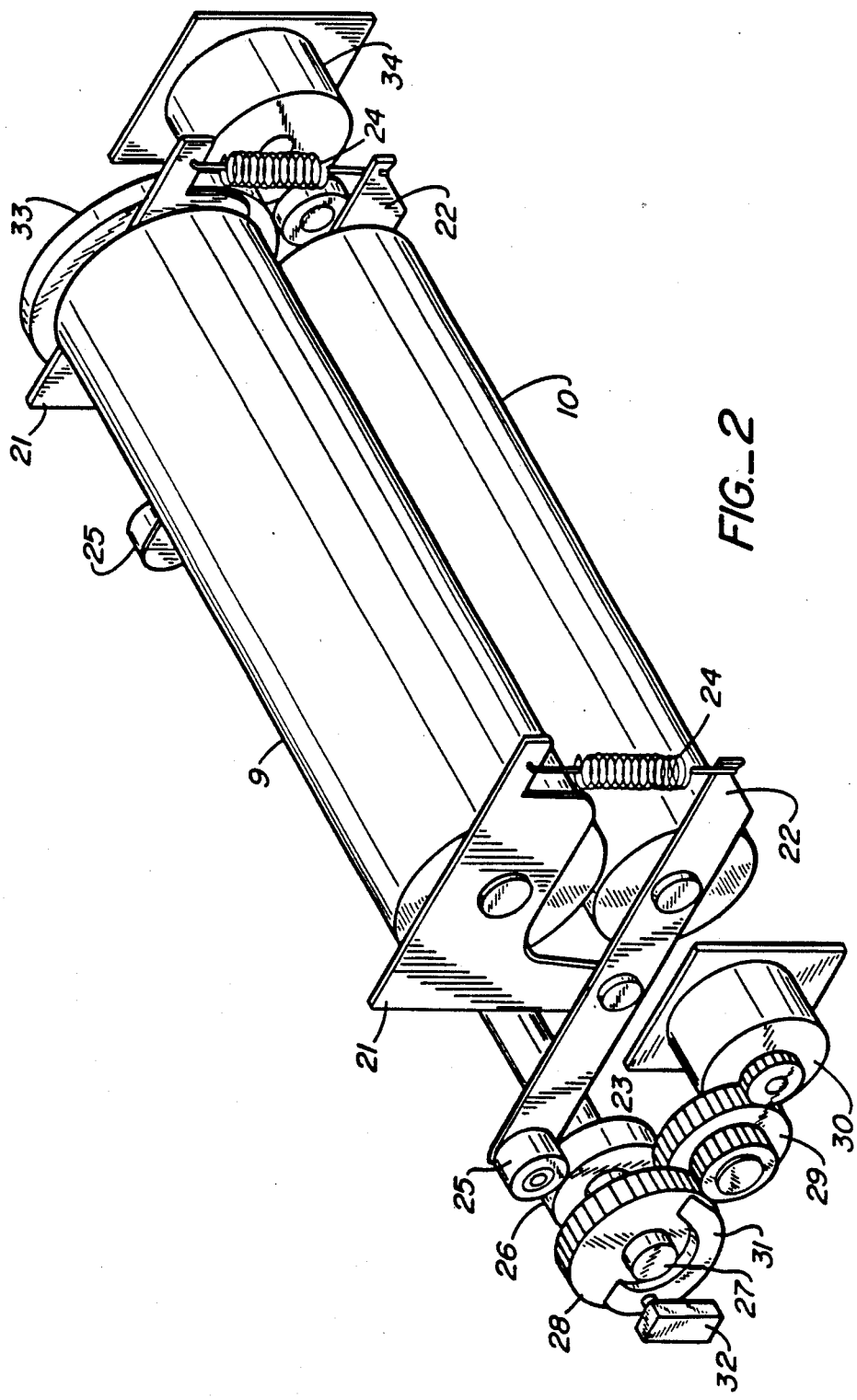
FIG._2

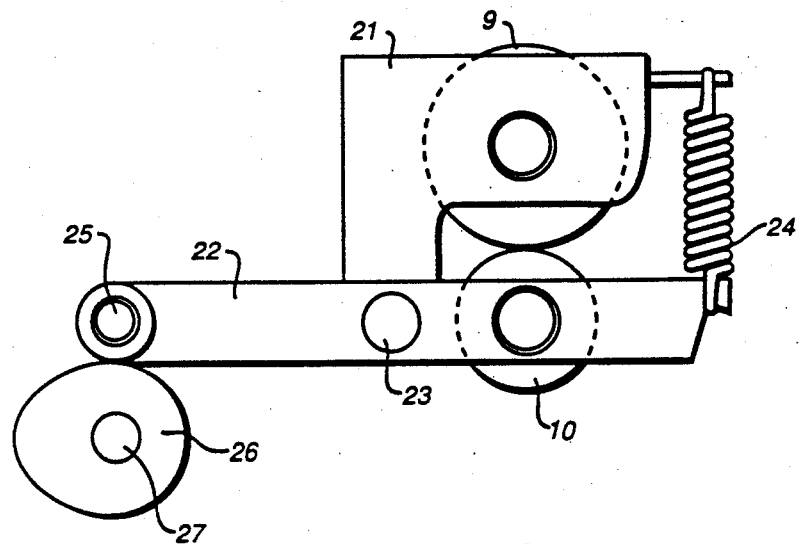
FIG._3A
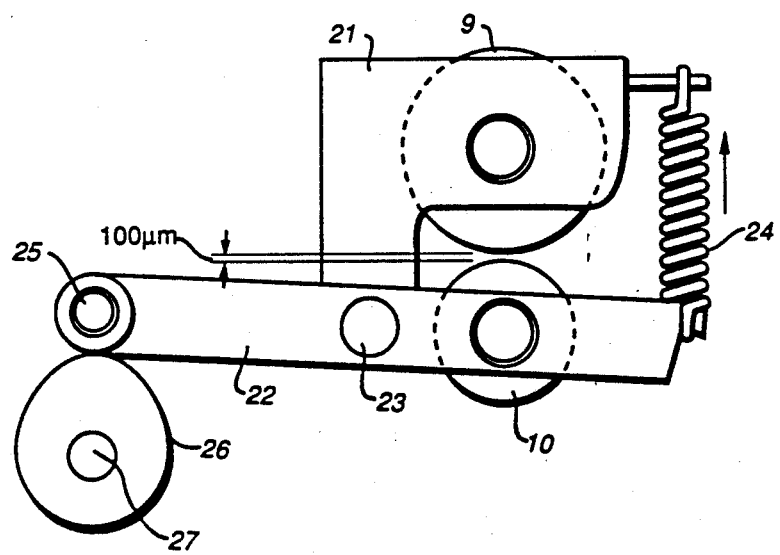
FIG._3B

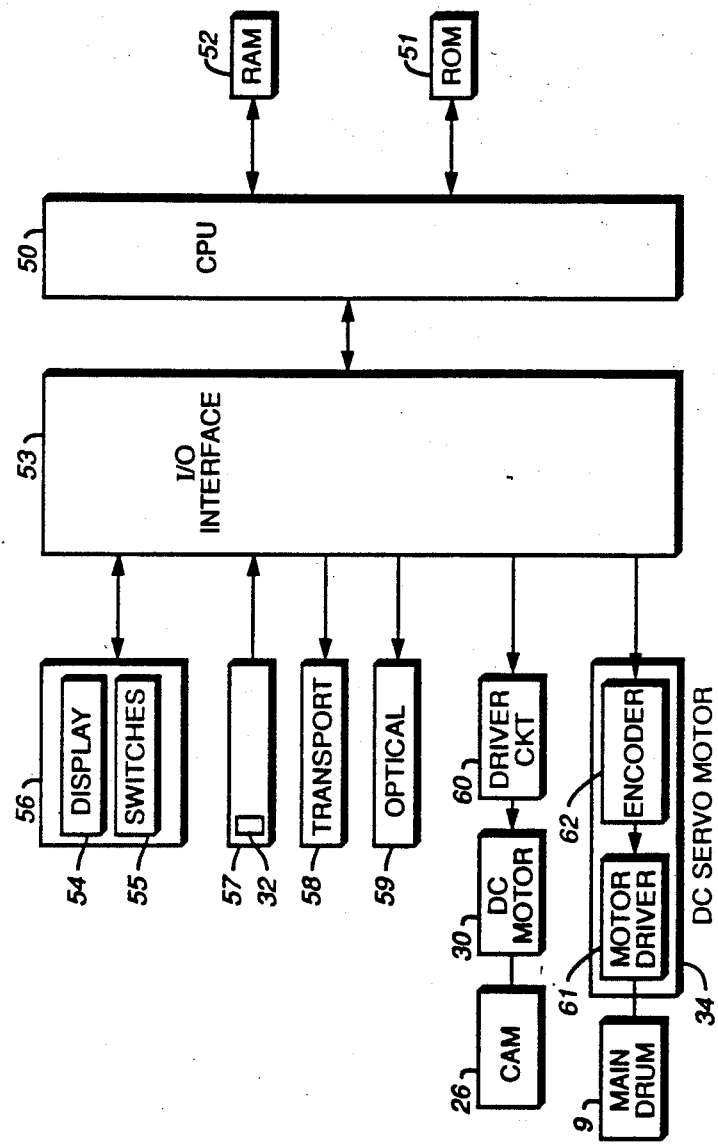
FIG._4

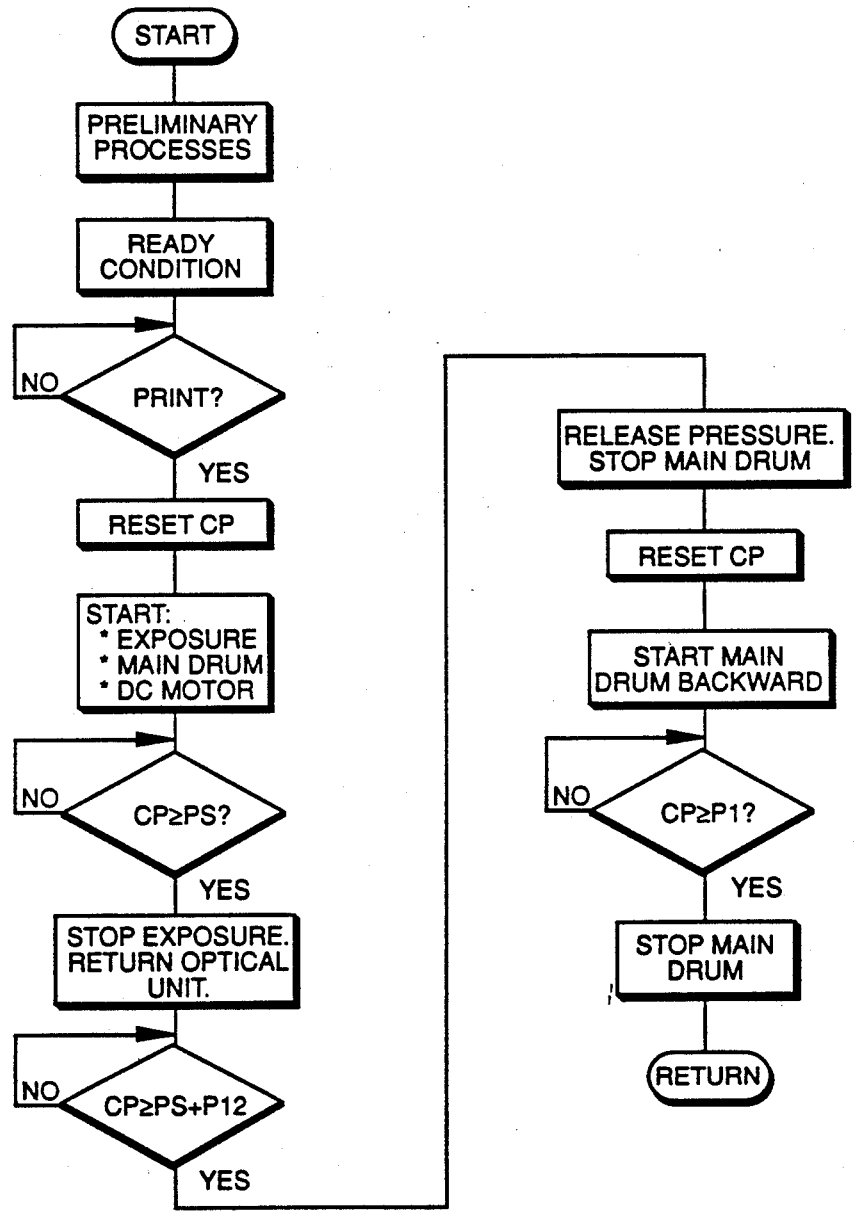
FIG._5

IMAGE FORMING APPARATUS AND METHOD

BACKGROUND OF THE INVENTION

This invention relates to an image forming apparatus and a method of image formation which make use of a light-accepting sheet coated with microcapsules encapsulating a colorless dye and a photopolymerizing agent and an image receiving sheet coated with a developer material and forms a color image on the image receiving sheet through exposure and compression processes.

Japanese Patent Publication Tokkai 58-88739 has disclosed a method of forming through exposure to light a selectively hardened image on a light-accepting sheet coated with microcapsules encapsulating a colorless dye and a photopolymerizing agent (such as photopolymerizing monomers) and compressing it together with an image receiving sheet coated with a developer material having a chromogenic effect on the dye to thereby form a color image on this image receiving sheet. When an image of an original document is projected on such a light-accepting sheet, microcapsules at areas exposed to light are hardened and a selectively hardened image is formed on the sheet. If an image receiving sheet coated with a developer matter is placed on top of this light-accepting sheet and pressed together therewith, microcapsules which have not been hardened are ruptured and the colorless dye encapsulated therein flows out and reacts chromogneically with the developer material on the image receiving sheet, forming a color image thereon. In summary, copies of an image from an original document can be obtained by a copier of a different kind provided with separate supply sections for light-accepting and image receiving sheets and merely by supplying sheets from these supply sections and carrying out exposure and compression processes. Since light-accepting sheets are coated with microcapsules which are weak against externally applied forces, however, the paper transporting system of such a copier must be carefully designed such that no external force will be applied on the microcapsules. Although cassettes are frequently used in devices for supplying sheets of paper, a paper supplying cassette requires a feeder roller which comes into contact with the sheet surface. Thus, cassettes are not preferable for use with light-accepting sheets coated with microcapsules.

In view of the above, it has been proposed to provide light-accepting sheets in the form of a roll and to wrap it around one of a pair of compression rollers such that they can be supplied without requiring the help of a paper feeder roller and that the rotary motion of the compression rollers themselves serves to supply them. With a copier thus structured, however, the so-called exposure point where light exposure takes place and the compression point where the compression rollers apply pressure are separated on the compression rollers. At the end of an image forming process, the wrapped roll of light-accepting sheets has already passed the exposure point by the same distance as that between the exposure and compression points. When the next image forming process is started, therefore, the part of the light-accepting sheet corresponding to this length cannot serve to form any image and is wasted.

Another problem with a copier of this type is that, since the compression rollers are usually set to apply a fairly large pressure therebetween when the light-accepting and image receiving sheets are compressed together, the light-accepting sheet which is constantly subjected to such a large pressure at the pressure point tends to become or to move along a zig-zag trajectory as it is transported thereby.

SUMMARY OF THE INVENTION

It is therefore an object of the present invention to a method of image formation and an image forming apparatus of the type using light-accepting and image receiving sheets which does not waste its light-accepting sheets.

It is another object of the present invention to provide a method of image formation and an image forming apparatus of the type described above which does not wrinkle its light-accepting sheets or cause them to advance in a zig-zag path.

The above and other objects of the present invention are achieved by providing an image forming apparatus of the type which uses light-accepting and image receiving sheets to form a latent image by selectively hardening microcapsules on the light-accepting sheet by exposing it to light and compressing the two sheets together by passing them between a pair of rollers to rupture only soft microcapsules against the image receiving sheet and is further characterized not only as having the light-accepting sheet in the form of a roll and wrapped half-way around the upper one of these rollers but also by the step of rotating this upper roller backwards after each cycle of image forming processes to move the portion of the light-accepting sheet to be wasted back to the starting position for the next cycle of image forming processes and also by a mechanism for separating the rollers apart such that pressure on the light accepting sheet is removed and the light-accepting sheet can automatically correct itself if it is beginning to wrinkle or to move sideways.

BRIEF DESCRIPTION OF THE DRAWINGS

The accompanying drawings, which are incorporated in and form a part of the specification, illustrate an embodiment of the present invention and, together with the description, serve to explain the principles of the invention. In the drawings:

FIG. 1 is a schematic sectional side view of an image forming apparatus embodying the present invention to show its basic structure, FIG. 2 is a diagonal view of the main drum and the compression roller shown in FIG. 1 as well as some components adjacent thereto, FIGS. 3A and 3B are drawings for showing the motion of the compression roller, FIG. 4 is a block diagram of a control unit for the apparatus of FIG. 1, and FIG. 5 is a flow chart for schematically showing the operation of the apparatus of FIG. 1.

In all these figures, corresponding components are indicated by the same numerals.

DETAILED DESCRIPTION OF THE INVENTION

With reference to FIG. 1 showing the structure of an image forming apparatus embodying the present apparatus embodying the present invention, numeral 1 indicates it housing structure with a document table 2 at the top. An original document 3 to be processed is placed on the document table 2 to be scanned by an optical unit 4 of a known kind comprised of two source lamps 40 and 41, mirrors 42-54 and a lens 46. A paper supply cassette 5 containing image receiving sheets 6 (not in the form of a roll but individually cut) is mounted at a lower right-hand part of the housing structure 1. A feeder roller 7 is provided to transport one sheet at a time from this paper supply cassette 5 through guiding rollers 8 to a compression section. The compression section of the apparatus is at a lower central part of the housing structure 1 and includes a main drum 9 and a compression roller 10 disposed below the main drum 9. A roll 11 of light-accepting sheets 13 is disposed around a rotatably supported shaft 12 adjacent to and slightly above the main drum 9. A take-up shaft 14 is disposed on the side of the roll 11 distal from the main drum 9. The light accepting sheets 13 supplied from the roll 11 are wrapped half-way around the main drum 9 and then taken up by the take-up shaft 14. An exposure point $P_1$ is defined on the surface of the main drum 9 as the point at which the beam of light reflected from the mirror 45 of the optical unit 4 is projected onto the main drum 9. The point $P_2$ at which the main drum 9 contacts the compression roller 10 is referred to as the compression point because this is where the light-accepting sheet 13 and the image receiving sheet 6 from the cassette 5 are superposed one on top of the other and sandwiched together between the main drum 9 and the compression roller 10.

Disposed adjacent to the compression point $P_2$ is a wedge-shaped separator 15 for separating the light-accepting sheet 13 and the image receiving sheet 6 after they have passed the compression point $P_2$ such that the image receiving sheet 6 drops onto a conveyor belt 17 disposed below as the light-accepting sheet 13 moves upward towards the take-up shaft 14. The conveyor belt 17 serves to transport the separated image receiving sheet 6 to the left-hand side of the housing structure 1 where heat rollers 18 are disposed for providing luster to the color image formed on the image receiving sheet 6. Not only is the image receiving sheet coated with a developer material as explained above but this developing material is also coated with a thermoplastic resin material which is melted when the image receiving sheet passes between the heat rollers 18, thereby making the surface of the color image uniform and producing a lustrous image as disclosed in Japanese Patent Publication Tokkai 60-259490. Further to the left of the heat rollers 18 are discharge rollers 19 and a discharge tray 20. The image receiving sheets, after a lustrous image has been formed thereon, are sequentially discharged onto the discharge tray 20. After passing through the compression point $P_2$, the light-accepting sheets 13 are wrapped around the take-up shaft 14.

The compression roller 10 is not only compressed against the main drum 9 but also supported so as to be able to move up and down. As will be explained below, the compression roller 10 is separated from the main drum 9 after each image forming process. When a print switch (not shown) is pressed to start a cycle of image forming processes, a light-accepting sheet 13 supplied from the roll 11 is exposed to light at the exposure point $P_1$ and then transported to the compression point $P_2$. During this time, the compression roller 10 is compressed against the main drum 9. At the exposure point $P_1$, photopolymerizing monomer inside the microcapsules at positions corresponding to white areas on the original document 3 hardens these microcapsules by undergoing a photopolymerization reaction. In other words, a latent image is formed on the light-accepting sheet 13 at the exposure point $P_1$ in the sense that microcapsules thereon are selectively hardened according to the pattern of the image on the original document 3. When the light-accepting sheet 13 now carrying thereon an invisible image pattern of hardened microcapsules is brought to the compression point $P_2$ and compressed together with the image receiving sheet 6, those microcapsules not hardened at the exposure point $P_1$ rupture and allow the colorless dye encapsulated therein to flow out thereof and to react chromogenically with the developer material on the image receiving sheet 6, thereby forming a color image thereon. In other words, a visible image of the original document 3 on the document table 2 is formed on the image receiving sheet 6 at the compression point $P_2$. The light-accepting sheet 13 which has thus served its purpose is thereafter moved away to be wrapped around the take-up shaft 14 while the image receiving sheet 6, now carrying thereon a visible color image, is separated from the light-accepting sheet 13 by the separator 15, transported to the heat rollers 18 to have its surface made lustrous and then discharged onto the discharge tray 20.

After a cycle of such image forming processes is completed, the main drum 9 is rotated backwards (in the counter-clockwise direction on FIG. 1) by the same angle as the angular separation between the exposure point $P_1$ and the compression point $P_2$. The light-accepting sheet 13 is thereby moved back by the same length as the distance between these two points along the circumference of the main drum 9. This serves to eliminate the waste of light-accepting sheet 13 which would otherwise result between successive cycles of image forming processes described above.

At the same time (that is, after the end of the series of image forming processes described above), the compression roller 10 is moved downward and set at another position separate from the main drum 9. As a result, the light-accepting sheet 13 is freed from external forces and is allowed to correct itself if it was beginning to wrinkle or to move in transverse direction.

With reference next to FIG. 2, ends of the shaft for the main drum 9 are supported by frames 21 which are affixed to the housing structure 1. Arms 22 are attached to lower parts of these frames 21 rotatably around support axes 23 and the shaft of the compression roller 10 is connected to these arms 22 at points some distance away from the support axes 23. Biasing springs 24 are stretched between the frames 21 and ends of the arms 22 such that the compression roller 10 tends to be compressed against the main drum 9. At the opposite end of each arm 22 distal from the spring 24, a small roller 25 serving as a cam follower is supported in contact with a cam 26. A gear 28 is attached to the axis 27 of the cam 26 and this gear 28 is in motion-communicating relationship with a DC motor 30 through a deceleration gear 29. A piece 21 is attached to the external surface of the gear 28 to protrude outwardly and about one-half way around along its periphery. A microswitch 32 with an actuator (not shown) is disposed adjacent to this external surface of the gear 28. The microswitch 32 is switched on when its actuator is opposite to and in face-to-face relationship with the protruding piece 31.

As the rotary motion of the DC motor 30 is communicated to the gear 28, the cams 26 are rotated. When the major axes of the cams 26 come into contact with the cam followers 25, the arms 22 are rotated in the counter-clockwise direction around their support axes 23, causing the compression roller 10 to move away from the main drum 9. When the minor axes of the cams 26 are in contact with the cam followers 25, the compression roller is compressed against the main drum 9. The protruding piece 31 on the gear 28 and the microswitch 32 serve to detect the position of the cams 26. The main drum 9 is driven through a gear 30 by a DC servo motor 34 of a type containing an encoder. Angular displacement of the main drum 9 is detected by this encoder. The DC servo motor 34 serves to keep the rotational speed of the main drum 9 constant when it is rotating.

FIGS. 3A and 3B show more clearly the vertical motion of the compression roller 10 with respect to the main drum 9 by the rotation of the cams 26. FIG. 3A shows the compression roller 10 when it is pressed against the main drum 9, the force therefor being supplied by the biasing springs 24. At this moment, the minor axes of the cams 26 are in contact with the cam followers 25 and the protruding piece 31 on the gear 28 is pressing the actuator of the microswitch 32, thereby keeping the microswitch 32 in the ON condition. Aforementioned series of image forming processes is carried out while the compression roller 10 is pressed against the main drum 9 as shown in FIG. 3A.

When the series of image forming processes comes to an end, the DC motor 30 begins to rotate, causing through the rotation of the gear 28 to rotate the cams 26 such that their major axes come to push the cam followers 25. This in turn causes the arms 22 to rotate in the clockwise direction against the biasing force of the springs 24 as shown in FIG. 3B, thereby moving the compression roller 10 to separate from the main drum 9. The compression roller 10 is adapted to stop at a position separated from the main drum 9 by about 100 ĺm. Since the light-accepting sheets 13 are about 30 ĺm in thickness, they experience no pressure at the compression point $P_2$ under the conditions shown in FIG. 3B.

As the next series of image forming processes is started, the DC motor 30 is rotated again and the condition shown in FIG. 3A returns. In summary, the DC motor 30 is rotated each time after image forming processes are completed and the compression roller 10 is separated from the main drum 9. Even if the light-accepting sheets 13 become wrinkled or start to move sideways during an image forming process, they can automatically correct themselves after the cycle of image forming processes when the compression roller 10 is separated from the main drum 9 and there is no external pressure applied on the light-accepting sheets 13.

As shown in FIG. 4, the control unit for the image forming apparatus described above is comprised of a central processing unit (CPU) 50 which is connected to a read-only memory (ROM) 51 storing programs, a random-access memory (RAM) 52 used as work areas and an I/O interface 53. Connected also to this I/O interface 53 are a control panel including a display device 54 and switches 55 to be operated, various sensors 57 inclusive of the aforementioned microswitch 32, a transportation system 38 for transporting image receiving sheets 6 from the cassette 5 and driving the conveyor belt 17, an optical system 59 for operating the aforementioned optical unit 4, a driver circuit 60 for the DC motor 30 connected to the cams 26 and the aforementioned DC servo motor 34 which includes not only an encoder 62 as explained above in connection with FIG. 2, but also a motor driving section for the main drum 9.

Next, operation of the image forming apparatus described above is summarized by way of the flow chart of FIG. 5. When power is switched on, the heat rollers 18 are heated and other preliminary processes are carried out (n1). When the print switch on the control panel 56 is pressed (n3) after a ready condition is reached (n2), a pulse counter CP assigned to the RAM 52 for counting the pulse outputted from the encoder 62 is reset (n4). The optical unit 4 is then operated to start the exposure of an original document, the DC servo motor 34 begins to rotate the main drum 9, and the DC motor 30 serves to press the compression roller 10 to the main drum 9 (n5). When the pulse number counted by the counter CP (also denoted by CP in FIG. 5) reaches a predetermined value PS corresponding to the length of the image receiving sheet 6 in the direction of its travel (n6), exposure of light is stopped and the optical unit 4 is returned to its initial position (n7). Next, when the value of the counter CP reaches the sum of PS which corresponds to the size of the image receiving sheet 6 and $P_{12}$ which corresponds to the distance between the exposure point $P_1$ and the compression point $P_2$ (n8), the DC motor 30 is operated to separate the compression roller 10 from the main drum 9 and the DC servo motor 34 stops the rotation of the main drum 9 (n9). In other words, the compression roller 10 is automatically moved away from the main drum 9 according to the present invention as soon as a cycle of image forming processes is completed. The pulse counter CP is then reset again (n10) and the main drum 9 is rotated backward (n11) by driving the DC servo motor 34 in the reverse direction. This is in order to eliminate the waste of the light-accepting sheet 13 between successive cycles of image forming processes as explained above. This backward rotation of the main drum 9 is stopped (n13) when the value of the counter CP reaches $P_{12}$ (n12) corresponding to the distance between the exposure point $P_1$ and the compression point $P_2$.

With an image forming apparatus thus structured and operated, cost of operation can be reduced and the light-accepting sheet is allowed to automatically correct its erroneous motion because the light-accepting sheet is moved backward and pressure applied thereon for image formation is removed after each cycle of image forming processes. The foregoing description of a preferred embodiment has been presented for purposes of illustration and description. It is not intended to be exhaustive or to limit the invention to the precise form disclosed, and many modifications and variations are possible in light of the above teaching. Any such modifications and variations that may be apparent to a person skilled in the art are intended to be included within the scope of this invention.

What is claimed is:

1. An image forming apparatus which uses a photosensitive sheet and a transfer sheet, said pohotosensitive sheet being coated with photocurable microcapsules encapsulating a photosensitive agent and a colorless dye and said transfer sheet being coated with a developer material having a chromogenic effect on said colorless dye by reacting therewith, said apparatus comprising
    exposing means for slit-exposing said photosensitive sheet at an exposure point to light through a slit while said photosensitive sheet is being transported in a forward direction,
    superposing means for superposing together said transfer sheet and said photosensitive sheet after said photosensitive sheet is exposed to light by said exposing means, pressure-developing means for developing an image by applying a pressure on said superposed sheets at a pressure point by means of a pair of rollers which are rotating, control means for thereafter stopping the rotation of said rotating rollers, pressure-releasing means for separating said pair of rollers away from each other, and reversing means for transporting said photosensitive sheet in a backward direction opposite said forward direction by a distance determined by the separation between said exposure point and said pressure point while said rollers are separated from each other.

2. The apparatus of claim 1 wherein said pair of rollers consists an upper roller and a lower roller, said photosensitive sheet being wrapped partially around said top roller.

3. The apparatus of claim 1 further comprising support means for supporting said pair of rollers such that one of said rollers is vertically movable and that a biasing force is applied to compress said pair of rollers against each other.

4. The apparatus of claim 1 wherein said control means include a central processing unit.

5. The apparatus of claim 1 wherein said pressure point is where said rollers contact each other.

6. An image forming method comprising the steps of slit-exposing a photosensitive sheet at an exposure point to image-carrying light through a slit while said photosenitive sheet is being transported in a forward direction, said photosensitive sheet being coated with photocurable microcapsules encapsulating a photosensitive agent and a colorless dye, superposing said exposed photosensitive sheet with a transfer sheet, said transfer sheet being coated with a developer material having a chromogenic effect on said colorless dye by reacting therewith, developing an image by applying a pressure on said superposed sheets at a pressure point by means of a pair of rotating rollers, stopping said rotating rollers after said image is developed, thereafter separating said rollers from each other, and transporting said photosensitive sheet in a backward direction opposite said forward direction by a distance determined by the separation between said exposure point and said pressure point while said rollers are separated from each other.

* * * * *